(12) United States Patent
Ee

(10) Patent No.: US 12,144,258 B2
(45) Date of Patent: Nov. 12, 2024

(54) SUSPENSION DESIGN WITH IMPROVED MICROACTUATOR SENSITIVITY AND MICROACTUATOR CONFIGURATIONS

(71) Applicant: Magnecomp Corporation, Murrieta, CA (US)

(72) Inventor: Kuen Chee Ee, Chino, CA (US)

(73) Assignee: Magnecomp Corporation, Murrieta, CA (US)

( * ) Notice: Subject to any disclaimer, the term of this patent is extended or adjusted under 35 U.S.C. 154(b) by 824 days.

(21) Appl. No.: 17/168,052

(22) Filed: Feb. 4, 2021

(65) Prior Publication Data

US 2021/0249585 A1 Aug. 12, 2021

Related U.S. Application Data

(60) Provisional application No. 62/971,606, filed on Feb. 7, 2020.

(51) Int. Cl.
| | | |
|---|---|---|
| H01L 41/09 | (2006.01) | |
| G11B 5/48 | (2006.01) | |
| H10N 30/20 | (2023.01) | |
| H10N 30/50 | (2023.01) | |
| H10N 30/853 | (2023.01) | |
| H10N 30/87 | (2023.01) | |

(52) U.S. Cl.
CPC ......... *H10N 30/2042* (2023.02); *G11B 5/484* (2013.01); *H10N 30/50* (2023.02); *H10N 30/8554* (2023.02); *H10N 30/872* (2023.02)

(58) Field of Classification Search
CPC ... H10N 30/2042; H10N 30/50; H10N 30/872
See application file for complete search history.

(56) References Cited

U.S. PATENT DOCUMENTS

| | | | |
|---|---|---|---|
| 8,797,690 B2 | 8/2014 | Tao et al. | |
| 2009/0080116 A1 | 3/2009 | Takahashi et al. | |
| 2014/0104722 A1* | 4/2014 | Wright | H10N 30/50 360/75 |
| 2017/0155033 A1* | 6/2017 | Ikeda | H10N 30/2041 |
| 2017/0316797 A1* | 11/2017 | Ee | H10N 30/045 |
| 2019/0214042 A1* | 7/2019 | Ee | H10N 30/063 |
| 2019/0311734 A1* | 10/2019 | Hahn | H10N 30/045 |

OTHER PUBLICATIONS

International Search Report and Written Opinion in International Application No. PCT/US2021/016901, mailed Apr. 23, 2021.
International Preliminary Report on Patentability in International Application No. PCT/US2021/016901, mailed Aug. 18, 2022.

\* cited by examiner

*Primary Examiner* — Bryan P Gordon
(74) *Attorney, Agent, or Firm* — DLA Piper LLP (US)

(57) ABSTRACT

A piezoelectric (PZT) actuator assembly having a fixed-end and a hinged-end is provided. The assembly includes a first side electrode at the hinge-end, and a second side electrode at the fixed-end. The assembly includes a third piezoelectric layer including a top surface and a bottom surface disposed over the top surface of the second PZT layer. A fourth electrode is at least partially disposed on the top surface of the third PZT layer. The fourth electrode is connected to the second side electrode at the fixed-end.

20 Claims, 4 Drawing Sheets

SUSPENSION DESIGN WITH IMPROVED MICROACTUATOR SENSITIVITY AND MICROACTUATOR CONFIGURATIONS

CROSS-REFERENCE TO RELATED APPLICATIONS

This application claims the benefit of U.S. Provisional Application No. 62/971,606 filed on Feb. 7, 2020, which is hereby incorporated by reference in its entirety.

FIELD

Embodiments of the disclosure relate to the field of suspension devices for disk drives. More particularly, this disclosure relates to the field of multi-layer actuator construction for a suspension device.

BACKGROUND

A typical disk drive unit includes a spinning magnetic disk containing a pattern of magnetic storage medium ones and zeroes. The pattern of magnetic storage medium ones and zeroes constitutes the data stored on the disk drive. The magnetic disk is driven by a drive motor. The disk drive unit also includes a disk drive suspension to which a magnetic read/write head is mounted proximate a distal end of load beam. The "proximal" end of a suspension or load beam is the end that is supported, i.e., the end nearest to the base plate which is swaged or otherwise mounted to an actuator arm. The "distal" end of a suspension or load beam is the end that is opposite the proximal end, i.e., the "distal" end is the cantilevered end.

The suspension is coupled to an actuator arm, which in turn is coupled to a voice coil motor that moves the suspension arcuately in order to position the head slider over the correct data track on the data disk. The head slider is carried on a gimbal which allows the slider to pitch and roll so that it follows the proper data track on the disk, allowing for such variations as vibrations of the disk, inertial events such as bumping, and irregularities in the disk's surface.

Both single stage actuated disk drive suspensions and dual stage actuated (DSA) suspension are known. In a single stage actuated suspension, only the voice coil motor moves the suspension.

In a DSA suspension a small actuator located on the suspension moves the head slider in order to position the head slider over the correct data track. The actuator provides both finer positioning of the head slider than does the voice coil motor, and provides higher servo bandwidth than does the voice coil motor. The actuator may be located in various places on the suspension depending on the particular DSA suspension design. Typically, left- and right-side actuators act in push-pull fashion to rotate the load beam or the distal end of the load beam.

SUMMARY

A piezoelectric (PZT) actuator assembly having a fixed-end and a hinged-end is provided. The assembly includes a first side electrode at the hinge-end, and a second side electrode at the fixed-end. The assembly also includes a first PZT layer including a top surface and a bottom surface. A first electrode is at least partially disposed on the bottom surface of the first PZT layer. A second piezoelectric layer including a top surface and a bottom surface is disposed over the top surface of the first PZT layer. The assembly also includes a second electrode at least partially disposed on the bottom surface of the second PZT layer and at least partially disposed on the top surface of the first PZT layer. The second electrode is connected to the second side electrode at the fixed-end.

The assembly also includes a third piezoelectric layer including a top surface and a bottom surface disposed over the top surface of the second PZT layer. A third electrode is at least partially disposed on the bottom surface of the third PZT layer and at least partially disposed on the top surface of the second PZT layer. The third electrode is connected to the first side electrode at the hinge-end. A fourth electrode is at least partially disposed on the top surface of the third PZT layer. The fourth electrode is connected to the second side electrode at the fixed-end.

In some embodiments, the first electrode includes a disconnected portion connected to the second side electrode at the fixed-end. In some embodiments, the fourth electrode includes a disconnected portion connected to the first side electrode at the hinge-end. In some embodiments, the disconnected portion connected to the first side electrode at the hinge-end is 0.05 mm. The fourth electrode can be 0.25 mm, with a tolerance of 25 μm. The second electrode can be 0.70 mm, with a tolerance of 25 μm. The fourth electrode can be 0.75 mm, with a tolerance of 25 μm.

A suspension is also provided. The suspension can include a flexure mounted to a load beam, the flexure including one or more electrical traces, and at least one multi-layer piezoelectric (PZT) microactuator coupled with at least one of the one or more electrical traces. As described above, the assembly can have a fixed-end and a hinged-end. The assembly includes a first side electrode at the hinge-end, and a second side electrode at the fixed-end. The assembly also includes a first PZT layer including a top surface and a bottom surface. A first electrode is at least partially disposed on the bottom surface of the first PZT layer. A second piezoelectric layer including a top surface and a bottom surface is disposed over the top surface of the first PZT layer. The assembly also includes a second electrode at least partially disposed on the bottom surface of the second PZT layer and at least partially disposed on the top surface of the first PZT layer. The second electrode is connected to the second side electrode at the fixed-end.

The assembly also includes a third piezoelectric layer including a top surface and a bottom surface disposed over the top surface of the second PZT layer. A third electrode is at least partially disposed on the bottom surface of the third PZT layer and at least partially disposed on the top surface of the second PZT layer. The third electrode is connected to the first side electrode at the hinge-end. A fourth electrode is at least partially disposed on the top surface of the third PZT layer. The fourth electrode is connected to the second side electrode at the fixed-end.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

In order to describe the manner in which the advantages and features of the disclosure can be obtained, embodiments of the present disclosure are described with reference to specific examples illustrated in the appended drawings. These drawings depict only example aspects of embodiments of the present disclosure, and are therefore not to be considered as limiting of its scope. The principles are described and explained with additional specificity and detail through the use of the following drawings.

DETAILED DESCRIPTION

Figure 1:
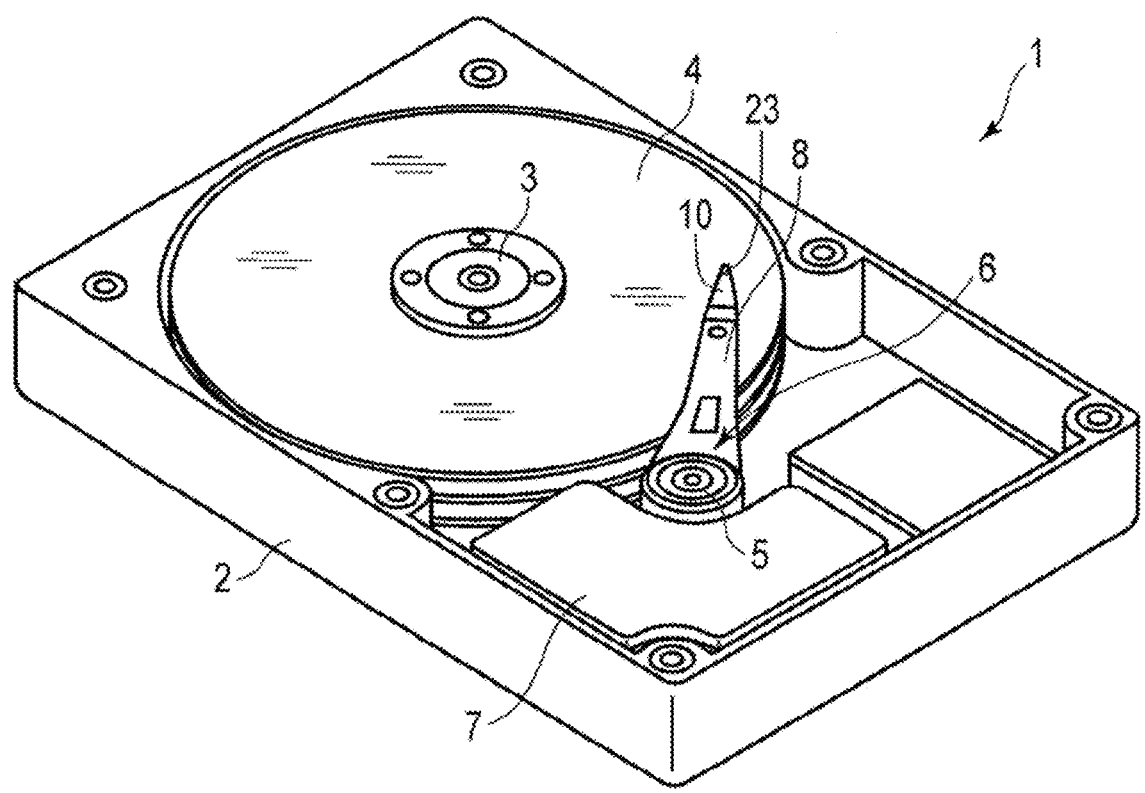
FIG. 1 is a perspective view showing a disk drive including a suspension in accordance with an embodiment of the disclosure.

The embodiments of the present disclosure are described with reference to the attached figures, wherein like reference numerals are used throughout the figures to designate similar or equivalent elements. The figures are not drawn to scale, and they are provided as exemplary illustrations. Several aspects of the embodiments are described below with reference to example applications, which are not intended to limit the scope of this disclosure. It should be understood that numerous specific details, relationships, and methods are set forth to provide a full understanding of the embodiments.

Embodiments described herein are directed to multi-layer microactuators that overcome problems in the current state of microactuators. For example, as the left- and right-side microactuators act in push-pull fashion to rotate a flexure mounted on the load beam or the distal end of flexure mounted on the load beam, both microactuators bend in the vertical direction.

FIG. 1 is a perspective view showing a disk drive 1, in accordance with an embodiment of the disclosure. The disk drive 1 can include a case 2, disks 4, carriage 6, and a positioning motor (voice coil motor) 7. The disks 4 are rotatable about a spindle 3. The carriage 6 are turnable about a pivot 5. The positioning motor (voice coil motor) 7 is implemented to actuate the carriage 6, etc. It should be understood that the case 2 is typically sealed; the case 2 is illustrated without a cover to illustrate all of the features therein.

The carriage 6 typically includes more than one carriage arms 8. A suspension 10 is mounted on the distal end portion of each arm 8. A slider (illustrated below in FIG. 2), which constitutes one or more read/write heads, is provided on the distal end portion of the suspension 10. In a state where each disk 4 rotates at high speed, an air bearing is formed between the disk and the slider 11 as air flows in between the disk 4 and slider 11. If the carriage 6 is turned by the positioning motor 7, the suspension 10 moves radially relative to the disk 4. Thereupon, the slider 11 moves to a desired track of the disk 4.

Figure 2:
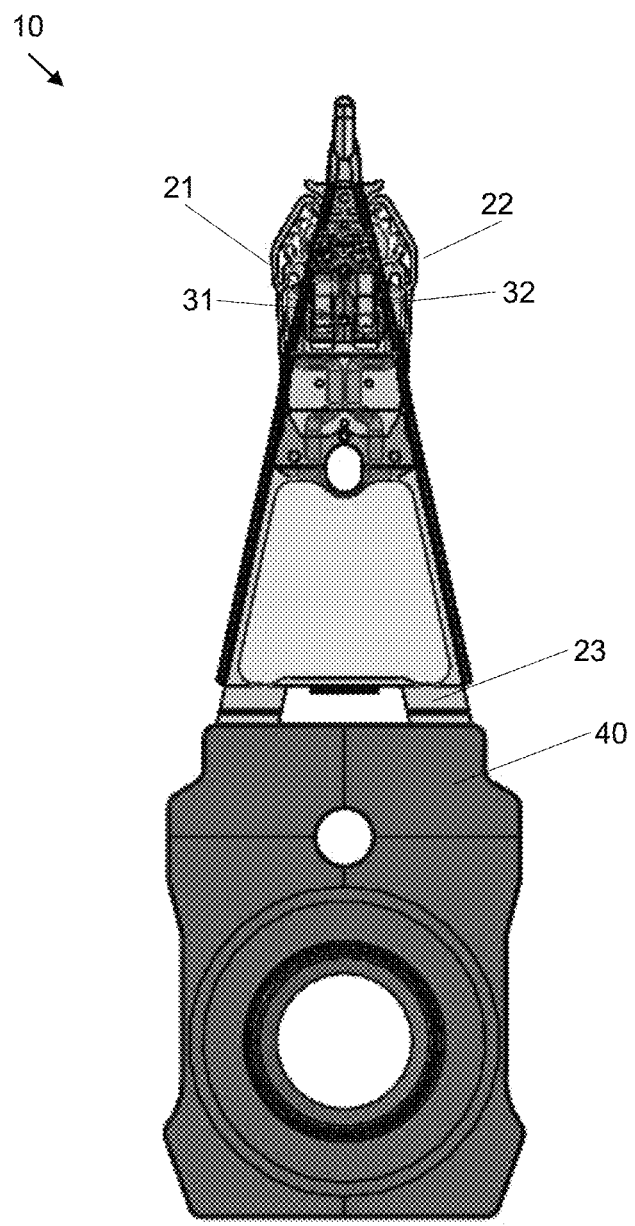
FIG. 2 is a perspective view showing the suspension 10 of FIG. 1, in accordance with an embodiment of the disclosure.

FIG. 2 is a perspective view showing the suspension 10 of FIG. 1, in accordance with an embodiment of the disclosure. The suspension 10 can be supported by a load beam 23. The suspension can include a flexure 22. The flexure 22 supports a gimbal 21. A slider, which constitutes a read/write head, is mounted on the gimbal 21. In some embodiments, the slider, for some embodiments, includes magnetoresistive (MR) elements, which are capable of converting between magnetic and electrical signals. The MR elements serve to access data, that is, write or read data to or from the disk (shown in FIG. 1).

The gimbal 21 includes microactuator elements 31 and 32. Microactuator elements 31 and 32, according to some embodiments, are formed of piezoelectric plates of lead zirconate titanate ("PZT") or the like. The microactuator elements 31 and 32 have the function of pivoting the slider in the sway direction by means of a structure. It should be understood, any configurations of microactuator elements may be implemented herein.

The suspension 10 includes a metal base 40. In some embodiments, the metal base 40 is formed of a stainless-steel plate. The suspension 10 also includes a conductive circuit portion including one or more conductors, such as traces. The conductive circuit portion includes a conductor that connects to the slider. The conductor can also connect to electrodes of the microactuator elements 31 and 32.

Figure 3:
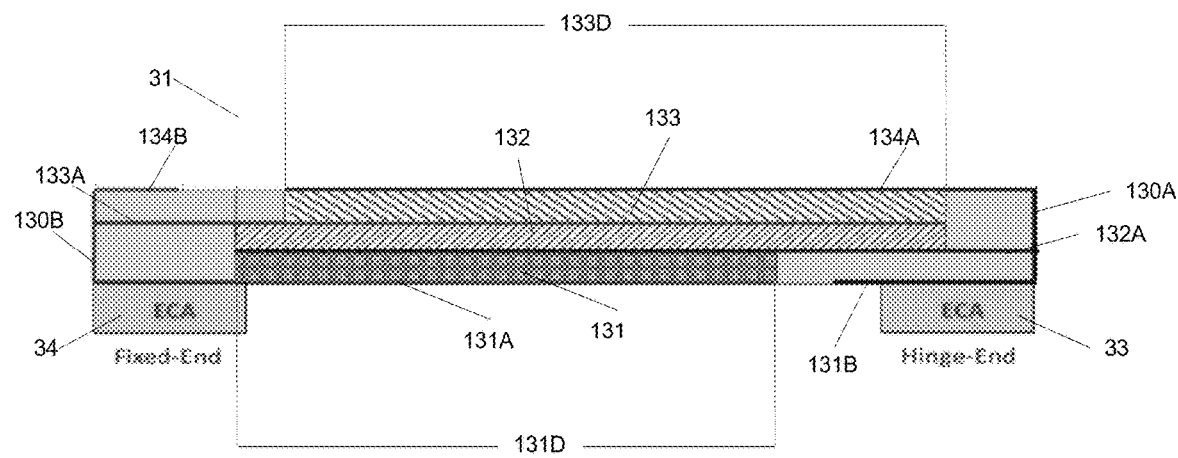
FIG. 3 illustrates a cross-sectional view of the microactuator element of FIG. 2, in accordance with an embodiment of the disclosure.

FIG. 3 illustrates a cross-sectional view of the microactuator element 31 of FIG. 2, in accordance with an embodiment of the disclosure. A piezoelectric element is often used as the microactuator motor, although static electric microactuators and other types of microactuator motors can be used. A commonly used piezoelectric material is lead zirconate titanate (PZT), although other piezoelectric materials may be used. In this disclosure, for simplicity, the piezoelectric device that is the microactuator may sometimes be referred to simply as a "PZT" for shorthand. It is recognized that the piezoelectric material need not be lead zirconate titanate. Thus, as used herein the term "PZT" can refer to any piezoelectric material or any piezoelectric device formed of any piezoelectric material.

The microactuator element 31 can be a multi-layer, with a first electrode 131A disposed on at least a portion of the bottom surface of the first PZT layer 131. The first electrode 131A can be connected to a second electrically conductive adhesive (ECA) 34 at a fixed-end. A disconnected portion 131B of the first electrode 131A can also be disposed on at least the portion of the bottom surface of the first PZT layer 131. The disconnected portion 131B can be connected to a first electrically conductive adhesive (ECA) 33 at a hinge-end. A second electrode 132A can be disposed between at least a portion of the first PZT layer 131 and the second PZT layer 132. A third electrode 133A can be disposed between at least a portion of the second PZT layer 132 and the third PZT layer 133. Finally, a fourth electrode 134A can be disposed on at least a portion of the top surface of the third PZT layer 133. A disconnected portion 134B of the fourth electrode 134A can be disposed on at least a portion of the top surface of the third PZT layer 133.

The shared lengths of the first electrode 131A and the second electrode 132A can define the effective electrode length 131D. Furthermore, the shared lengths of the third electrode 133A and the fourth electrode 134A can define the effective electrode length 133D. The fixed-end refers to the leading edge end of the head gimbal assembly 21 (shown in FIG. 2), while the hinge-end refers to the trailing edge end of the head gimbal assembly 21. In some embodiments, the length of the fourth electrode 134A is 0.64 mm with a tolerance of 25 micrometers.

The fourth electrode 134A is connected to a first side electrode 130A at the hinge-end of the microactuator element 31. The third electrode 133A is connected to a second side electrode 130B at the fixed-end of the microactuator element 31. The first side electrode 130A is connected to the first ECA 33; whereas, the second side electrode 130B is connected to the second ECA 34.

In this configuration, the tolerance of the fourth electrode 134A has a great impact on the gimbal torsion mode at ~ 10.5 kHz of PZT FRF. Different lower lengths of the fourth electrode 134A results in more variations of the PZT FRF, specifically around 0.335 mm Z-ht. The large variation, in return, will impact the servo bandwidth of the disk drive 1 (of FIG. 1).

Figure 4:
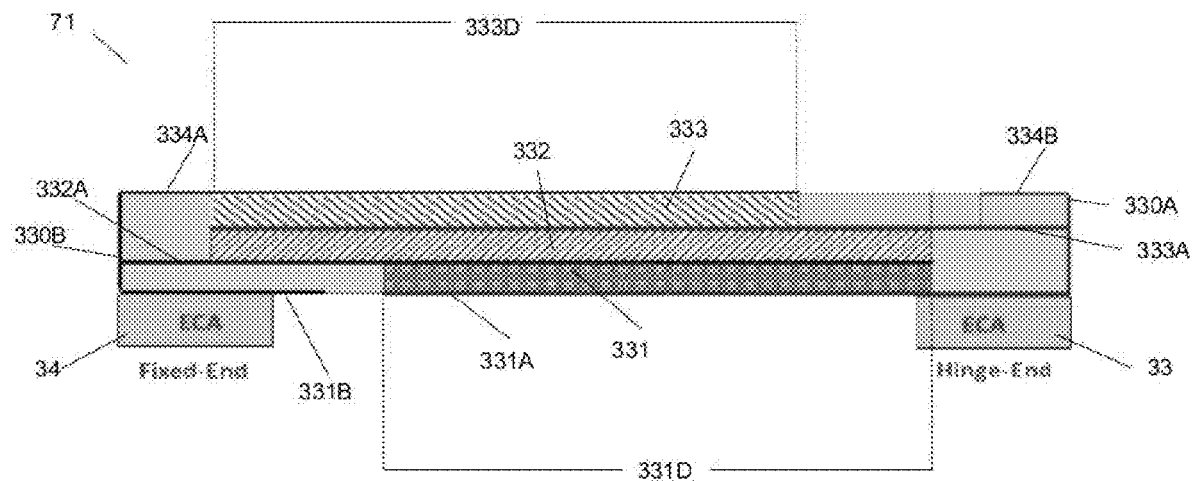
FIG. 4 illustrates a cross-sectional view of an alternative microactuator element, in accordance with an embodiment of the disclosure.

FIG. 4 illustrates a cross-sectional view of an alternative microactuator element 71, in accordance with an embodiment of the disclosure. The fixed-end refers to the leading edge end of the gimbal 21 (shown in FIG. 2), while the hinge-end refers to the trailing edge end of the gimbal 21. In some embodiments, the total length of the microactuator element 71 can be 0.80 mm, with a tolerance of 25 µm. The microactuator element 71 can be a multi-layer PZT, with a first electrode 331A disposed on at least a portion of the bottom surface of the first PZT layer 331. The first electrode 331A can be connected to first electrically conductive adhesive (ECA) 33 at a hinged-end. A disconnected portion 331B of the first electrode 331A can also be disposed on at least the portion of the bottom surface of the first PZT layer 331. The disconnected portion 331B can be connected to a second electrically conductive adhesive (ECA) 34 at a fixed-end. A second electrode 332A can be disposed between at least a portion of the first PZT layer 331 and a second PZT layer 332.

A third electrode 333A can be disposed between at least a portion of the second PZT layer 332 and a third PZT layer 333. Finally, a fourth electrode 334A can be disposed on at least a portion of the top surface of the third PZT layer 333. A disconnected portion 334B of the fourth electrode 334A can be disposed on at least a portion of the top surface of the third PZT layer 333. The disconnected portion 334B can be connected to the first ECA 33 at the hinged-end 33, via a first side electrode 330A. In some embodiments, the disconnected portion 334B can be 0.05 mm, with a tolerance of 25 µm. The fourth electrode 334A can be connected to the second ECA 34 at the fixed-end, via a second side electrode 330B. The first side electrode 330A is connected to the first ECA 33; whereas, the second side electrode 330B is connected to the second ECA 34.

The shared lengths of the first electrode 331A and the second electrode 332A can define the effective electrode length 331D. Furthermore, the shared lengths of the third electrode 333A and the fourth electrode 334A can define the effective electrode length 333D. In the microactuator element 71, the fourth electrode 334A is arranged to directly connect to the second side electrode 330B, at the fixed end. The fourth electrode 334A is also shortened with respect to the fourth electrode 134A, in FIG. 3, to maintain a near-zero phase angle at nominal distance from the baseplate flange to the data disk surface, also referred to as "z-height" or Z-ht. In some cases, the near-zero phase angle is 2 degrees. In some embodiments, the fourth electrode 334A can be 0.25 mm, with a tolerance of 25 µm, the second electrode 332A can be 0.70 mm, with a tolerance of 25 µm, and the third electrode 333A can be 0.75 mm, with a tolerance of 25 µm.

By connecting the electrode 334A to the second side electrode 330B, at the fixed end, several benefits are realized. In some embodiments, the variation at low Z-ht is reduced from ~60° to ~40°. Another benefit is that because of the partial constraining layer construction (CLC) configuration, according to some embodiments, the stroke is increased from 11 nm/V to 13.6 nm/V.

Figure 5:
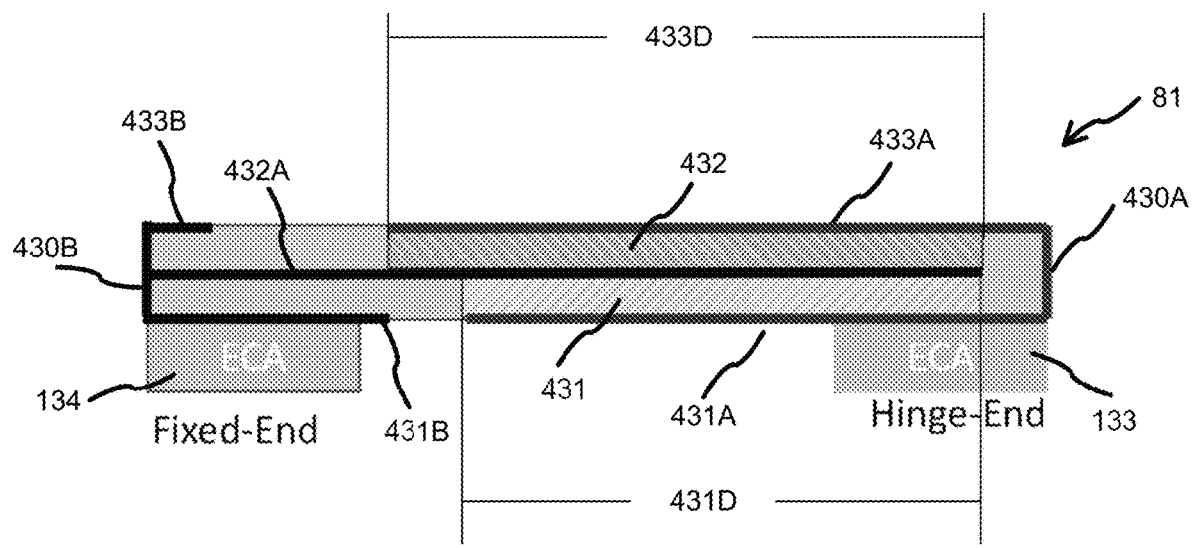
FIG. 5 illustrates a cross-sectional view of a microactuator element including two PZT layers, in accordance with an embodiment of the disclosure.

FIG. 5 illustrates a cross-sectional view of the microactuator element 81, in accordance with an embodiment of the disclosure. The microactuator element 81 can be a multi-layer, with a first electrode 431A disposed on at least a portion of the bottom surface of the first PZT layer 431. The first electrode 431A can be connected to a second electrically conductive adhesive (ECA) 134 at a fixed-end. A disconnected portion 431B of the first electrode 431A can also be disposed on at least the portion of the bottom surface of the first PZT layer 431. The disconnected portion 431B can be connected to a first electrically conductive adhesive (ECA) 133 at a hinge-end. A second electrode 432A can be disposed between at least a portion of the first PZT layer 431 and the second PZT layer 432. A third electrode 433A can be disposed on at least a portion of the top surface of the second PZT layer 432. A disconnected portion 433B of the third electrode 433A can be disposed on at least a portion of the top surface of the second PZT layer 432.

The shared lengths of the first electrode 431A and the second electrode 432A can define the effective electrode length 431D. Furthermore, the shared lengths of the third electrode 433A and the second electrode 432A can define the effective electrode length 433D. The fixed-end refers to a leading edge end of a head gimbal assembly, for example, such as the head gimbal assembly illustrated in FIG. 2, while the hinge-end refers to a trailing edge end of a head gimbal assembly.

The third electrode 433A and the first electrode 431A are connected to a first side electrode 430A at the hinge-end of the microactuator element 81. The third electrode 433B, the second electrode 432A, and the disconnected portion 431B are connected to a second side electrode 430B at the fixed-end of the microactuator element 31. The first side electrode 430A is connected to the first ECA 33; whereas, the second side electrode 430B is connected to the second ECA 134.

Figure 6:
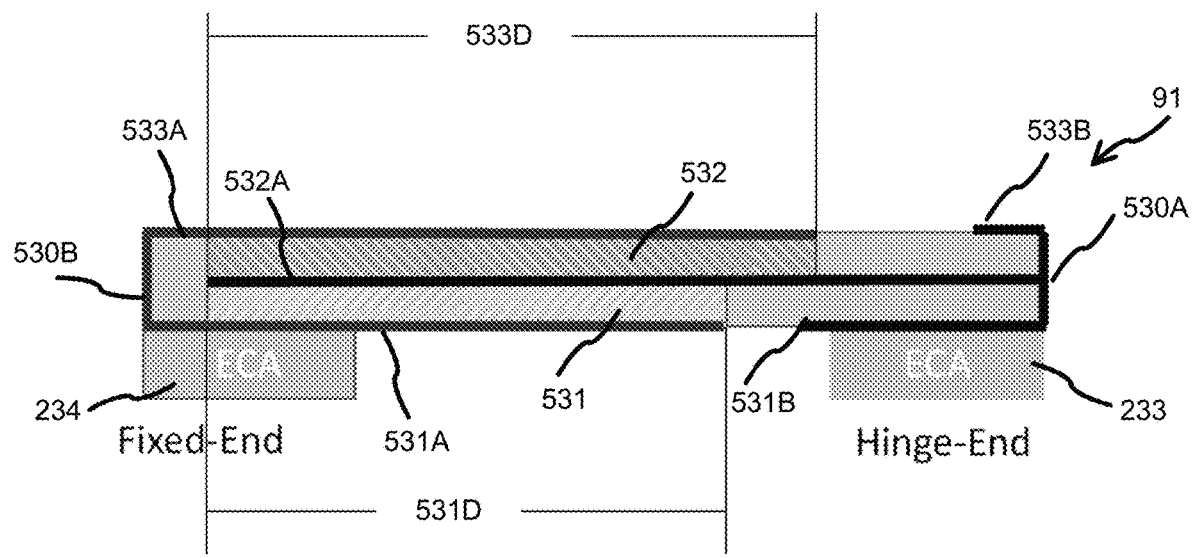
FIG. 6 illustrates a cross-sectional view of an alternative microactuator element including two PZT layers, in accordance with an embodiment of the disclosure.

FIG. 6 illustrates a cross-sectional view of an alternative microactuator element 91, in accordance with an embodiment of the disclosure. The fixed-end refers to the leading edge end of a gimbal, for example, such as the gimbal 21 as illustrated in FIG. 2, while the hinge-end refers to a trailing edge end of a gimbal. In some embodiments, the total length of the microactuator element 91 can be 0.80 mm, with a tolerance of 25 µm. The microactuator element 91 can be a multi-layer PZT, with a first electrode 531A disposed on at least a portion of the bottom surface of the first PZT layer 531. The first electrode 531A can be connected to first electrically conductive adhesive (ECA) 234 at a fixed-end. A disconnected portion 531B of the first electrode 531A can also be disposed on at least the portion of the bottom surface of the first PZT layer 531. The disconnected portion 531B can be connected to a second electrically conductive adhesive (ECA) 233 at a hinged-end. A second electrode 532A can be disposed between at least a portion of the first PZT layer 531 and a second PZT layer 532.

A third electrode 533A can be disposed on at least a portion of the top surface of the second PZT layer 532. A disconnected portion 533B of the third electrode 534A can be disposed on at least a portion of the top surface of the second PZT layer 532. The disconnected portion 533B can be connected to the first ECA 233 at the hinged-end, via a first side electrode 530A. In some embodiments, the disconnected portion 533B can be 0.05 mm, with a tolerance of 25 μm. The third electrode 533A can be connected to the second ECA 234 at the fixed-end, via a second side electrode 530B. The first side electrode 530A is connected to the first ECA 233, the second electrode 532A and the disconnected portion 531B. Whereas, the second side electrode 530B is connected to the second ECA 234.

The shared lengths of the first electrode 531A and the second electrode 532A can define the effective electrode length 531D. Furthermore, the shared lengths of the third electrode 533A and the second electrode 532A can define the effective electrode length 533D. In the microactuator element 91, the third electrode 533A is arranged to directly connect to the second side electrode 530B, at the fixed end. For some embodiments, the length of the third electrode 533A is also shortened is configured to maintain a near-zero phase angle at nominal distance from the baseplate flange to the data disk surface, also referred to as "z-height" or Z-ht. In some cases, the near-zero phase angle is 2 degrees.

By connecting the third electrode 534A to the second side electrode 530B, at the fixed end, several benefits are realized. In some embodiments, the variation at low Z-ht is reduced from ~60° to ~40°. Another benefit is that because of the partial constraining layer construction (CLC) configuration, according to some embodiments, the stroke is increased from 11 nm/V to 13.6 nm/V.

The disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. An actuator assembly having a fixed-end and a hinged-end, the assembly comprising:
    a first side electrode at the hinged-end;
    a second side electrode at the fixed-end;
    a first piezoelectric (PZT) layer including a top surface and a bottom surface;
    a first electrode at least partially disposed on the bottom surface of the first PZT layer, wherein a disconnected portion of the first electrode is separate from the first electrode and disposed along a portion of the bottom surface of the first PZT layer and configured to be electrically connected to an electrically conductive adhesive at the fixed-end via the second side electrode;
    a second PZT layer including a top surface and a bottom surface disposed over the top surface of the first PZT layer;
    a second electrode at least partially disposed on the bottom surface of the second PZT layer and at least partially disposed on the top surface of the first PZT layer, wherein the second electrode is connected to the second side electrode at the fixed-end;
    a third PZT layer including a top surface and a bottom surface disposed over the top surface of the second PZT layer;
    a third electrode at least partially disposed on the bottom surface of the third PZT layer and at least partially disposed on the top surface of the second PZT layer, wherein the third electrode is connected to the first side electrode at the hinged-end; and
    a fourth electrode at least partially disposed on the top surface of the third PZT layer, wherein the fourth electrode is connected to the second side electrode at the fixed-end, wherein a disconnected portion of the fourth electrode is separate from the fourth electrode and disposed along a portion of the top surface of the third PZT layer and configured to be electrically connected to an electrically conductive adhesive at the hinged-end via the first side electrode, and wherein a length of the disconnect portion of the fourth electrode is less than a length of the disconnect portion of the first electrode.

2. The PZT actuator assembly of claim 1, wherein the first electrode includes a disconnected portion connected to the second side electrode at the fixed-end.

3. The PZT actuator assembly of claim 1, wherein the disconnected portion connected to the first side electrode at the hinged-end is 0.05 mm.

4. The PZT actuator assembly of claim 1, wherein the fourth electrode is 0.25 mm, with a tolerance of 25 μm.

5. The PZT actuator assembly of claim 1, wherein the second electrode is 0.70 mm, with a tolerance of 25 μm.

6. The PZT actuator assembly of claim 1, wherein the fourth electrode is 0.75 mm, with a tolerance of 25 μm.

7. A suspension comprising:
    a flexure mounted to a load beam, the flexure including one or more electrical traces;
    at least one multi-layer piezoelectric (PZT) microactuator coupled with at least one of the one or more electrical traces and having a fixed-end and a hinged-end, each of the multi-layer PZT actuator assembly comprising:
    a first side electrode at the hinged-end;
    a second side electrode at the fixed-end;
    a first (PZT) layer including a top surface and a bottom surface;
    a first electrode at least partially disposed on the bottom surface of the first PZT layer, wherein a disconnected portion of the first electrode is separate from the first electrode and disposed along a portion of the bottom surface of the first PZT layer and configured to be electrically connected to an electrically conductive adhesive at the fixed-end via the second side electrode;
    a second PZT layer including a top surface and a bottom surface disposed over the top surface of the first PZT layer;
    a second electrode at least partially disposed on the bottom surface of the second PZT layer and at least partially disposed on the top surface of the first PZT layer, wherein the second electrode is connected to the second side electrode at the fixed-end;
    a third PZT layer including a top surface and a bottom surface disposed over the top surface of the second PZT layer;
    a third electrode at least partially disposed on the bottom surface of the third PZT layer and at least partially disposed on the top surface of the second PZT layer, wherein the third electrode is connected to the first side electrode at the hinged-end; and
    a fourth electrode at least partially disposed on the top surface of the third PZT layer, wherein the fourth electrode is connected to the second side electrode at the fixed-end, wherein a disconnected portion of the fourth electrode is separate from the fourth electrode and disposed along a portion of the top surface of the third PZT layer and configured to be electrically connected to an electrically conductive adhesive at the hinged-end via the first side electrode, and wherein a length of the disconnect portion of the fourth electrode is less than a length of the disconnect portion of the first electrode.

8. The suspension of claim 7, wherein the first electrode includes a disconnected portion connected to the second side electrode at the fixed-end.

9. The suspension of claim 7, wherein the disconnected portion connected to the first side electrode at the hinged-end is 0.05 mm.

10. The suspension of claim 7, wherein the fourth electrode is 0.25 mm, with a tolerance of 25 μm.

11. The suspension of claim 7, wherein the second electrode is 0.70 mm, with a tolerance of 25 μm.

12. The suspension of claim 7, wherein the fourth electrode is 0.75 mm, with a tolerance of 25 μm.

13. An actuator assembly having a fixed-end and a hinged-end, the assembly comprising:
   a first side electrode;
   a second side electrode;
   a first piezoelectric (PZT) layer including a top surface and a bottom surface;
   a first electrode at least partially disposed on the bottom surface of the first PZT layer, wherein a disconnected portion of the first electrode is separate from the first electrode and disposed along a portion of the bottom surface of the first PZT layer and configured to be electrically connected to an electrically conductive adhesive at the hinged-end via the first side electrode;
   a second PZT layer including a top surface and a bottom surface disposed over the top surface of the first PZT layer;
   a second electrode at least partially disposed on the bottom surface of the second PZT layer and at least partially disposed on the top surface of the first PZT layer, wherein the second electrode is connected to the second side electrode; and
   a third electrode at least partially disposed on the top surface of the second PZT layer, wherein the third electrode is connected to the first side electrode, wherein the third electrode includes a disconnected portion connected to the second side electrode at a hinged-end, wherein the disconnected portion of the third electrode is separate from the third electrode and disposed along a portion of the top surface of the second PZT layer and configured to be electrically connected to an electrically conductive adhesive at the hinged-end via the second side electrode.

14. The PZT actuator assembly of claim 13, wherein the first electrode includes a disconnected portion connected to the second side electrode at a fixed-end.

15. The PZT actuator assembly of claim 13, wherein the disconnected portion connected to the first side electrode at the hinged-end is 0.05 mm.

16. The PZT actuator assembly of claim 13, wherein the fourth electrode is 0.25 mm, with a tolerance of 25 μm.

17. The PZT actuator assembly of claim 13, wherein the second electrode is 0.70 mm, with a tolerance of 25 μm.

18. The PZT actuator assembly of claim 13, wherein the fourth electrode is 0.75 mm, with a tolerance of 25 μm.

19. The PZT actuator assembly of claim 13, wherein the first electrode includes a disconnected portion connected to the second side electrode at a hinged-end.

20. The PZT actuator assembly of claim 13, wherein the third electrode includes a disconnected portion connected to the first side electrode at a fixed-end.

* * * * *